(12) United States Patent
Fuller et al.

(10) Patent No.: US 7,370,253 B2
(45) Date of Patent: May 6, 2008

(54) APPARATUS AND METHOD FOR HIGH-SPEED SAS LINK PROTOCOL TESTING

(75) Inventors: Paul Fuller, Georgetown, TX (US); Arthur J. Gregorcyk, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 133 days.

(21) Appl. No.: 11/448,328

(22) Filed: Jun. 7, 2006

(65) Prior Publication Data

US 2008/0008435 A1 Jan. 10, 2008

(51) Int. Cl.
*G01R 31/28* (2006.01)

(52) U.S. Cl. ......................... 714/724; 714/30

(58) Field of Classification Search ............... 439/76.1; 379/429; 398/37; 438/638; 714/724, 30
See application file for complete search history.

(56) References Cited

U.S. PATENT DOCUMENTS

| | | | | |
|---|---|---|---|---|
| 5,443,390 A | * | 8/1995 | Kokkosoulis et al. | 439/76.1 |
| 5,513,259 A | * | 4/1996 | Pettit | 379/429 |
| 5,642,217 A | * | 6/1997 | Carbone et al. | 398/37 |
| 6,106,307 A | * | 8/2000 | Goslicki et al. | 439/76.1 |
| 6,248,663 B1 | * | 6/2001 | Bixler et al. | 438/638 |
| 2004/0196062 A1 | | 10/2004 | Fuller et al. | |
| 2005/0108452 A1 | | 5/2005 | Loffink et al. | |
| 2005/0289263 A1 | | 12/2005 | Ramsey et al. | |
| 2006/0075155 A1 | | 4/2006 | Fuller et al. | |

* cited by examiner

*Primary Examiner*—David Ton
(74) *Attorney, Agent, or Firm*—Larson Newman Abel Polansky & White, LLP

(57) ABSTRACT

An apparatus for changing a connection between two serial components on the same circuit board. The apparatus comprises at least one column, and each column includes first, second, third and fourth pads. The first pad communicates with a first breakout connector disposed on the circuit board. The second pad communicates with a second breakout connector disposed on the circuit board. The third pad communicates with one of the serial components. The fourth pad communicates with the other of the serial components and with the third pad during normal operation.

18 Claims, 3 Drawing Sheets

US 7,370,253 B2

APPARATUS AND METHOD FOR HIGH-SPEED SAS LINK PROTOCOL TESTING

FIELD OF THE DISCLOSURE

This disclosure relates generally to information handling systems, and more particularly to an apparatus and method for testing a high-speed serial attached SCSI protocol link.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Serial attached small computer system interface (SAS) is a serial point-to-point topology commonly used in server and storage environments. A problem in both environments is the testing of high-speed protocol links without degrading the signal. In many serial point-to-point topologies, breaking out the link to a protocol analyzer is not a challenging feat. For example, a protocol analyzer can be easily connected to a host controller or a hard drive.

In the SAS topology, point-to-point links running between chips on the same board are common. Moreover, even the smallest stub on the line can have dramatic effects on the signal quality and overall robustness of the platform. A more complex solution must be found for breaking out links that normally would not route to an off board connector.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Figure 1:
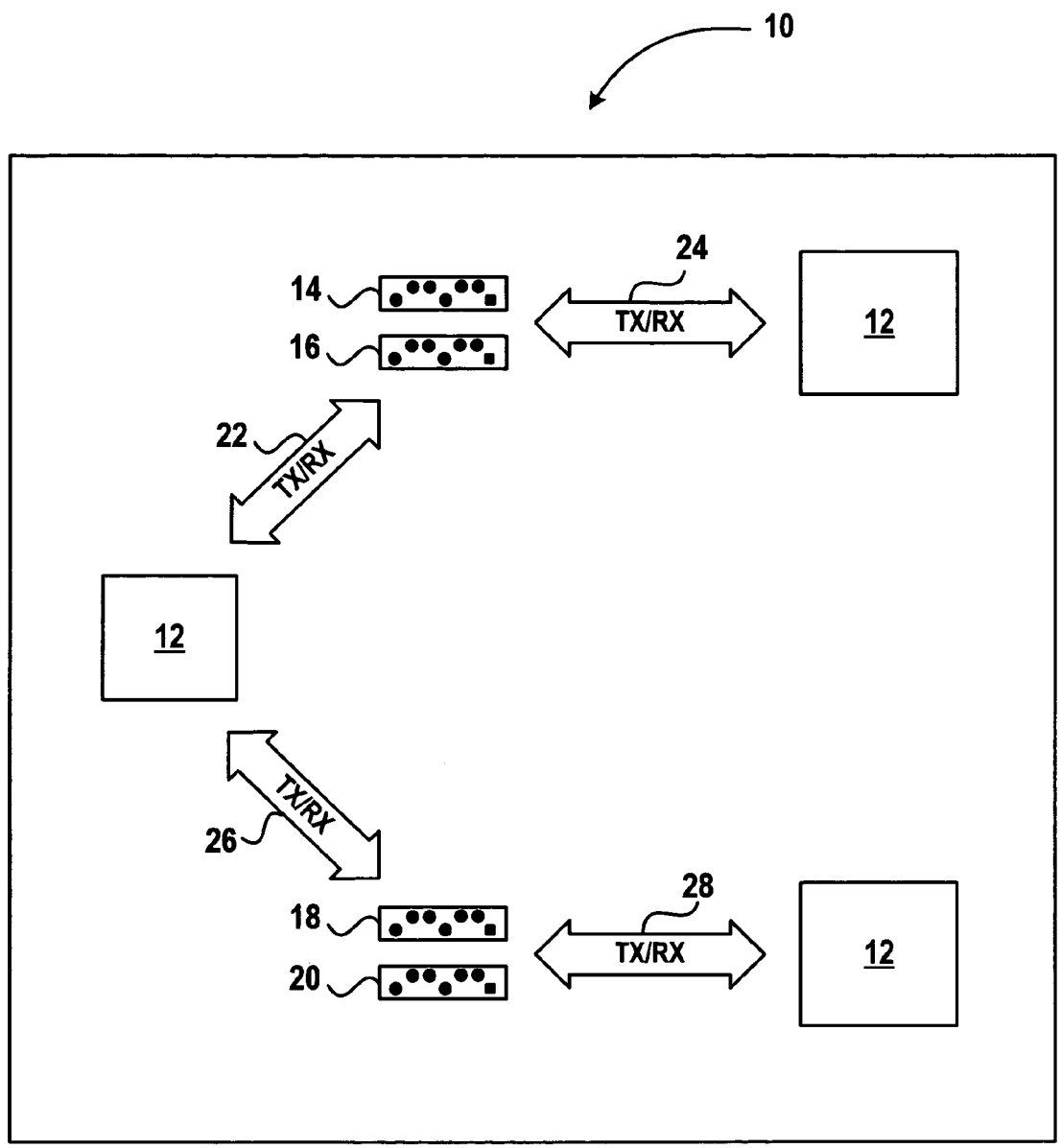
FIG. 1 is a schematic view of a circuit board including SAS expander chips and breakout connectors.
Figure 2:
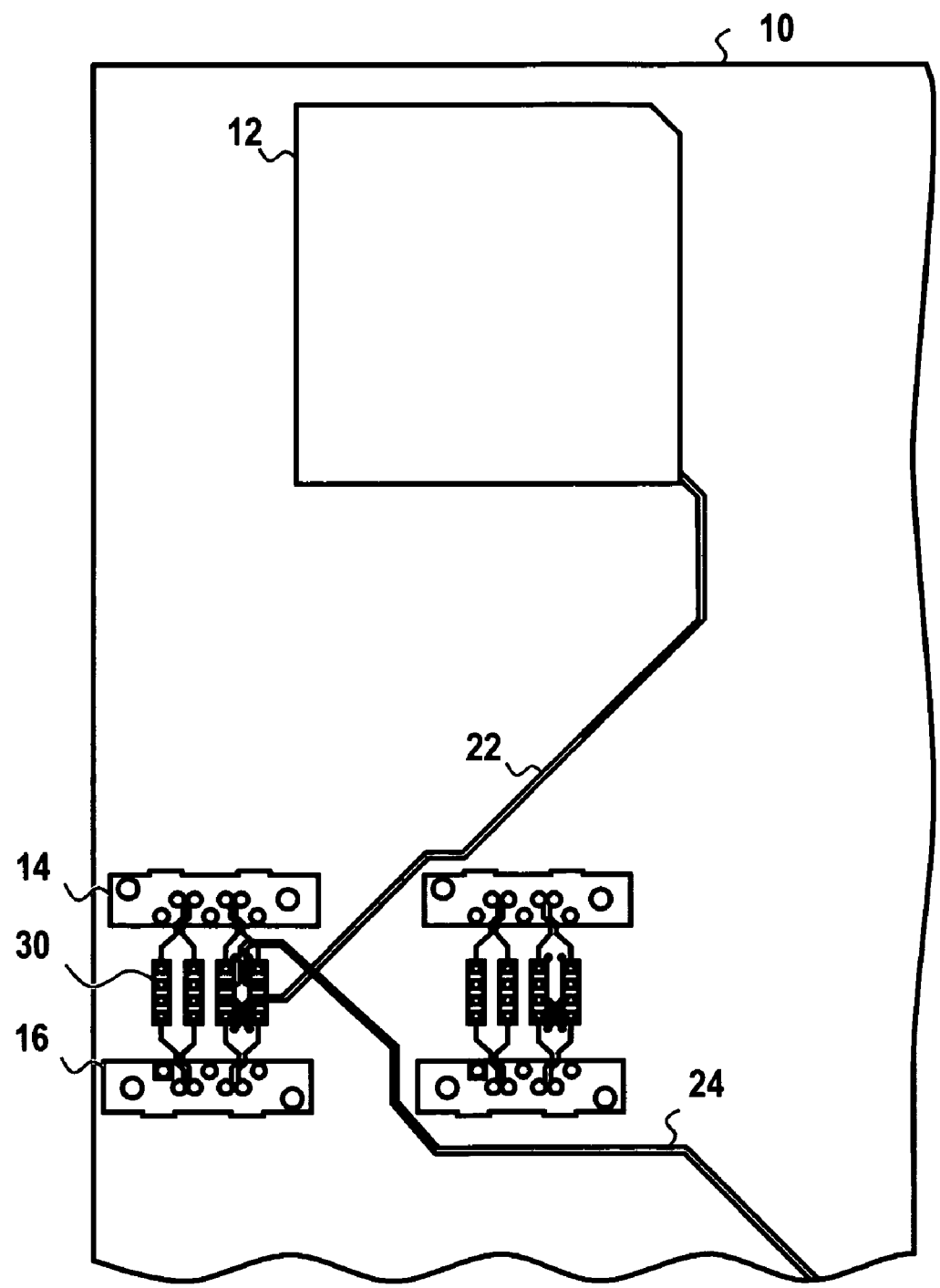
FIG. 2 is a plan view of a portion of a circuit board similar to that shown in FIG. 1.

FIGS. 1 and 2 show a circuit board 10 for an information handling system. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

The circuit board 10 includes a plurality of SAS expander chips 12 and a plurality of breakout connectors 14, 16, 18 and 20. Transmit and receive (TX/RX) circuitry 22, 24, 26 and 28, as is well known in the art, interconnects the SAS expander chips 12 and pins near the breakout connectors. Further details of one example of such pins are shown in U.S. Patent Application Publication No. 2004/0196062, the disclosure of which is hereby incorporated by reference.

Figure 3:
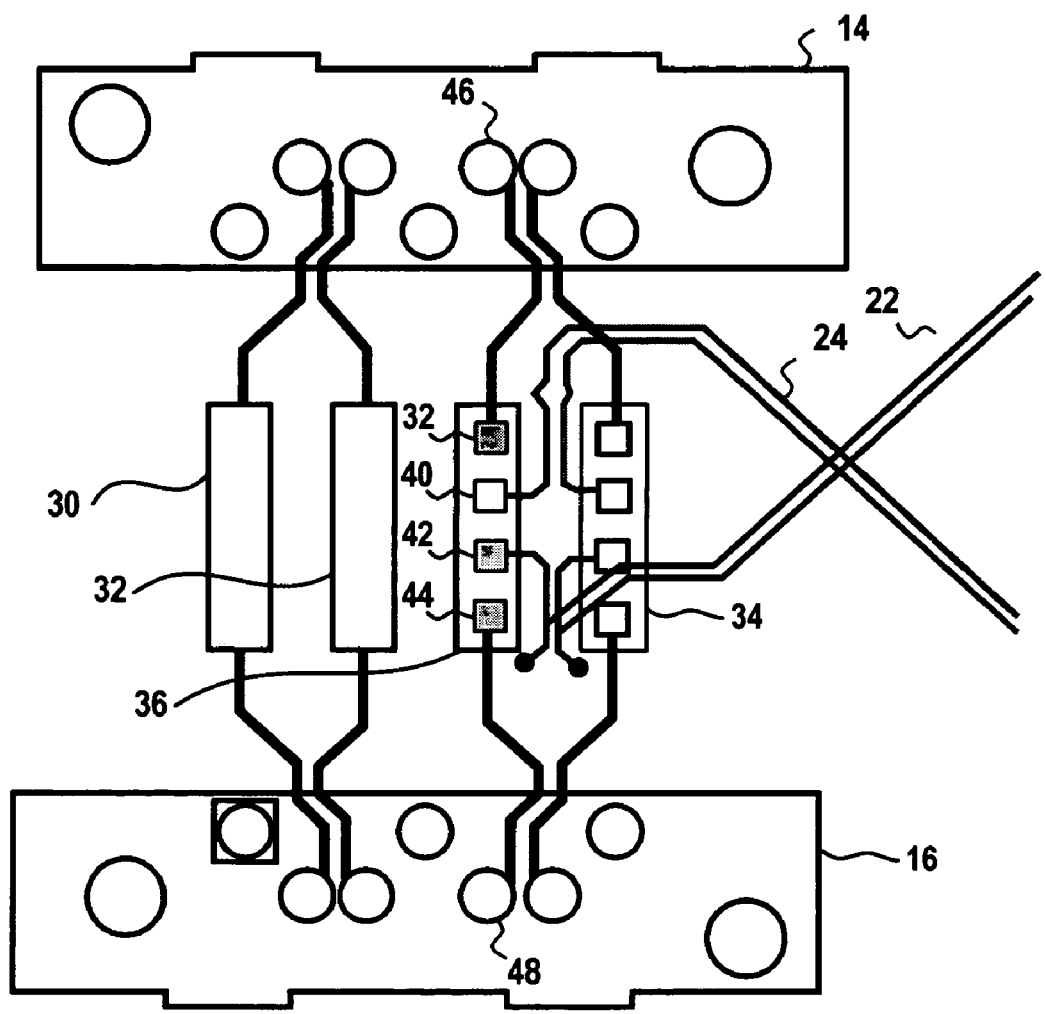
FIG. 3 is a plan view of a portion of the circuit board shown in FIG. 2 and showing pair of breakout connectors.

FIG. 3 shows the breakout connectors 14 and 16 in greater detail. Four columns 30, 32, 34 and 36 are disposed between the breakout connectors. The columns 30, 32, 34 and 36 correspond to TX+, TX−, RX− and RX+ electrical paths, respectively. Each column includes four pads 38, 40, 42 and 44. The uppermost pad 38 is in electrical communication with a TX/RX pad 46 of the breakout connector 14, while the lowermost pad 44 is in electrical communication with a TX/RX pad 48 of the breakout connector 16. During normal operation of the circuit board, the pads 40 and 42 are in electrical communication, such as through an AC coupling capacitor. The resulting electrical path from an SAS expander chip 12 is thus through the TX/RX lines 24, pad 40, the capacitor, pad 42, and out through TX/RX lines 22 to another SAS expander chip.

To insert a protocol analyzer in series such as for testing, the inner pads 40 and 42 are depopulated, i.e. the electrical connection between them is broken. Instead, the two outer pairs of pads 38, 40 and 42, 44 are populated, i.e. an electrical connection is established between them such as with capacitors. This operation establishes electrical communication with the pads 46 and 48, and thus the breakout connectors 14 and 16 are in series with the SAS expander chips 12 such that the protocol analyzer may be easily and usefully engaged.

Without the breakout links, it would be impossible to debug an issue between the two on board SAS devices. This solution does not add any cost to the board and preserves the entire signal integrity of the link while providing an easy method to view the protocol transactions of the link. Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An apparatus for changing a connection between two serial components on the same circuit board, the apparatus comprising:
    at least one column, each column including first, second, third and fourth pads;
    the first pad communicating with a first breakout connector disposed on the circuit board;
    the second pad communicating with a second breakout connector disposed on the circuit board;
    the third pad communicating with one of the serial components; and
    the fourth pad communicating with the other of the serial components and with the third pad during normal operation.

2. The apparatus of claim 1 wherein communication between the third pad and the fourth pad is broken, and the third pad communicates with the first pad, and the fourth pad communicates with the second pad.

3. The apparatus of claim 1 wherein the column is disposed on the circuit board between the first breakout connector and the second breakout connector.

4. The apparatus of claim 1 further comprising second, third and fourth columns disposed on the circuit board.

5. The apparatus of claim 1 wherein the first pad communicates with a TX/RX pad of the first breakout connector, and the second pad communicates with a TX/RX pad of the second breakout connector.

6. The apparatus of claim 1 wherein the fourth pad communicates with the third pad through a capacitor.

7. A circuit board comprising:
    a first serial component and a second serial component;
    a first breakout connector and a second breakout connector;
    at least one column, each column including first, second, third and fourth pads;
    the first pad communicating with the first breakout connector;
    the second pad communicating with the second breakout connector;
    the third pad communicating with the first serial component; and
    the fourth pad communicating with the second serial component and with the third pad during normal operation.

8. The circuit board of claim 7 wherein communication between the third pad and the fourth pad is broken, and the third pad communicates with the first pad, and the fourth pad communicates with the second pad.

9. The circuit board of claim 7 wherein the column is disposed between the first breakout connector and the second breakout connector.

10. The circuit board of claim 7 further comprising second, third and fourth columns.

11. The circuit board of claim 7 wherein the first pad communicates with a TX/RX pad of the first breakout connector, and the second pad communicates with a TX/RX pad of the second breakout connector.

12. The circuit board of claim 7 wherein the fourth pad communicates with the third pad through a capacitor.

13. The circuit board of claim 7 wherein the serial component comprises a serial attached SCSI expander chip.

14. A method for testing a link between two serial components on the same circuit board, the method comprising:
    providing at least one column, each column including first, second, third and fourth pads;
    providing a first breakout connector disposed on the circuit board and communicating with the first pad;
    providing a second breakout connector disposed on the circuit board and communicating with the second pad;
    connecting the third pad and one of the serial components;
    connecting the fourth pad with the other of the serial components and with the third pad for normal operation;
    breaking the connection between the third pad and the fourth pad; and
    establishing a connection between the third pad and the first pad, and between the fourth pad and the second pad.

15. The method of claim 14 wherein the column is disposed on the circuit board between the first breakout connector and the second breakout connector.

16. The method of claim 14 further comprising providing second, third and fourth columns disposed on the circuit board.

17. The method of claim 14 wherein the first pad communicates with a TX/RX pad of the first breakout connector, and the second pad communicates with a TX/RX pad of the second breakout connector.

18. The method of claim 14 wherein the fourth pad is connected to the third pad with a capacitor.

* * * * *